United States Patent [19]
Murai

[11] Patent Number: 5,410,183
[45] Date of Patent: Apr. 25, 1995

[54] CONTACT STRUCTURE OF SEMICONDUCTOR DEVICE AND METHOD OF MANUFACTURING THE SAME

[75] Inventor: Ichiro Murai, Sagamihara, Japan

[73] Assignee: Nippon Steel Corporation, Tokyo, Japan

[21] Appl. No.: 275,667

[22] Filed: Jul. 15, 1994

Related U.S. Application Data

[63] Continuation of Ser. No. 995,372, Dec. 23, 1992, abandoned.

[30] Foreign Application Priority Data

Dec. 27, 1991 [JP] Japan .................................. 3-359672

[51] Int. Cl.⁶ ..................... H01L 29/04; H01L 23/48; H01L 29/44; H01L 25/52
[52] U.S. Cl. ........................................ 257/750; 257/754
[58] Field of Search ............... 257/296, 409, 347, 377, 257/774, 750, 754, 755; 156/643, 644

[56] References Cited

U.S. PATENT DOCUMENTS 4,754,318  6/1988  Momose et al. ..................... 257/754
5,174,858 12/1992  Yamamoto et al. ................. 257/301

*Primary Examiner*—Andrew J. James
*Assistant Examiner*—S. V. Clark
*Attorney, Agent, or Firm*—Pollock, Vande Sande & Priddy

[57] ABSTRACT

A contact structure of a semiconductor device comprises a lamination of at least first insulating film, first conductive film and second insulating film formed in that order a through hole formed to penetrate through at least the first insulating film and the first conductive film so that a cross-section of the first conductive film is exposed to the through-hole and a second conductive film formed on an inner surface of the through-hole so that the second conductive film electrically contacts with the cross-section of the first conductive film.

12 Claims, 3 Drawing Sheets

CONTACT STRUCTURE OF SEMICONDUCTOR DEVICE AND METHOD OF MANUFACTURING THE SAME

This application is a continuation of Ser. No. 07/995,372, filed Dec. 23, 1992, now abandoned.

FIELD OF THE INVENTION

The present invention relates to a contact structure of a semiconductor device and a method of manufacturing the same. The contact structure is suitable to be applied to a semiconductor device such as an SRAM (static random access memory) having two high resistance loads and four transistor cells, wherein it is desired to make a contact resistance between a thin film wiring pattern made of polysilicon or the like constituting each resistance of the cell and a metal wiring higher, thereby realizing high integration, high package density and low power consumption.

BACKGROUND OF THE INVENTION

In FIG. 2, there is shown an equivalent circuit of a memory cell for an SRAM arranged by two high resistance loads and four transistor cells. This memory cell is constructed as a flip-flop circuit. In the flip-flop circuit, a pair of inverter transistors Q1 and Q2 are connected to load resistors R1 and R2 at respective nodes 30 and 31, and the load resistors R1 and R2 are connected via nodes 32 and 33, respectively, to a power supply voltage line "Vcc". A data communication with an external circuit of this memory cell is carried out by way of gate transistors Q3 and Q4 connected at the nodes 30 and 31. In this figure, symbol "WL" shows a word line, whereas symbols BL and BL' denote bit lines.

Although there is another type of SRAM using 6 transistor cells by replacing load transistors for the load resistors R1 and R2 shown in FIG. 2, the 4-transistor cell structure using a high resistance load becomes more popular, in which the thin film wiring made of high-resistance polysilicon is employed as the load resistors, as shown in FIG. 2, to reduce the cell area.

FIG. 3 is a schematic sectional view of the conventional structure of a portion of the above-described nodes 30 and 31. As represented in this figure, a high-resistance polysilicon thin film 103 constituting the load resistor R1 or R2 is formed on an inter-layer insulating film 102 fabricated on a silicon substrate 101. This high-resistance thin polysilicon film 103 is connected to a metal wiring 105 formed on this thin polysilicon film via a contact hole 106 formed in an inter-layer insulating film 104 formed on the polysilicon thin film.

As shown in the figure, according to this conventional structure, the contact hole 106 is formed to penetrate only the inter-layer insulating film 104, and also the electric connection between the high-resistance polysilicon thin film 103 and the metal wiring 105 is achieved such that the metal wiring 105 is in contact with the entire surface of the polysilicon thin film exposed to a bottom of the contact hole 106.

On the other hand, in the above-described 4-transistor cell using the high-resistance load, very recently, a demand to increase more and more the resistance value of its load resistance portion becomes larger with the need to achieve high integration and low power consumption. However, there is a limitation in decreasing the thickness of the polysilicon film, which constitutes the load resistance, due to a reliability of the load resistor. On the other hand, there is another practical limitation in reducing the size of the semiconductor device in view of integration.

SUMMARY OF THE INVENTION

An object of the present invention is to provide a contact structure of a semiconductor device, such as an SRAM (static random access memory) using 4-transistor cells and a high resistance load, capable of realizing high integration and low power consumption of the semiconductor device by increasing a resistance value of its load resistance portion without reducing its reliability.

To solve the above-described problems, according to one aspect of the present invention, a contact structure of a semiconductor device comprises: a first conductive film; an inter-layer insulating film formed on the first conductive film; a second conductive film formed on the inter-layer insulating film; a third conductive film formed on an inner surface of a through hole which penetrates the second conductive film, the inter-layer insulating film and the first conductive film and electrically connected to the second conductive film; and a connection portion provided at the inner surface of the through hole formed in the first conductive film to be electrically connected to the third conductive film. Also, it is preferable to further comprise a stopper formed under the first conductive film oppositingly to the throgh hole to be used when the through hole is formed. Then, it is preferable that an insulating film is formed below the first conductive film and the stopper is formed below the insulating film. The insulating film is preferably formed by an insulating material such as silicon dioxide. The inter-layer insulating film is preferably formed by an insulating material such as silicon dioxide. Also, the stopper is formed of a material selected from polysilicon, metal, and silicide.

Furthermore, according to another aspect of the present invention, in a semiconductor device wherein a first conductive film formed below an inter-layer insulating film is electrically connected to a second conductive film formed at an upper side of the inter-layer insulating film via a contact hole formed in the inter-layer insulating film, a contact structure is formed such that a through hole aligned to the contact hole is formed to the first conductive film, and a connection portion used to connect the first conductive film with the second conductive film is provided at an inner surface of the through hole extending to the first conductive film. In the contact structure, an etching resist film functioning as an etching stopper when the through hole is formed to the first conductive film by way of an etching process is formed in an insulating film below the first conductive film at least at a position corresponding to the contact hole.

A method of manufacturing a contact structure of a semiconductor device, according to another aspect of the present invention, comprises the steps of: forming a first conductive film on an insulating film formed on a semiconductor substrate; forming an inter-layer insulating film on the first conductive layer; fabricating a through hole aligned with a contact hole through the inter-layer insulating film and the first conductive film; and forming a second conductive film on an upper surface of the inter-layer insulating film, an inner surface of the contact hole, and an inner surface of the through hole.

A method of manufacturing a contact structure of a semiconductor device, according to a further aspect of the present invention, comprises the steps of: forming a first insulating film on a semiconductor substrate; forming an etching resist film at a selected position of the first insulating film; forming a second insulating film on the etching resist film and the first insulating film; forming a first conductive film on the second insulating film; forming a third insulating film functioning as an inter-layer insulating film on the first conductive film; forming a contact hole in the third insulating film just above the etching resist film by etching the third insulating film, the first conductive film and the second insulating film, and also forming a through hole aligned with the contact hole in the first conductive film; and forming a second conductive film on an upper surface of the third insulating film, an inner surface of the contact hole and an inner surface of the through hole.

With the above-described structure according to the present invention, the electric connection between two conductive films sandwiching the inter-layer insulating film can be provided with a high resistance value by reducing the contact area therebetween. As a consequence, for instance, a resistance value of the load resistor portion of the 4-transistor cell having a high resistance load in an SRAM can be increased at a contact portion thereof, and high integration/low power consumption can be achieved in the semiconductor device without deteriorating the characteristics thereof.

In order to reduce the contact area between the two conductive films without making smaller the size of the contact hole, the through hole aligned with the contact hole is formed in the conductive film positioned below the inter-layer insulating film and the two conductive films are arranged to contact with each other at an inner surface of the through hole. As a consequence, there is no technical problem, which would be caused by making the dimension of the contact hole small, and also there is substantially no possibility of occurrence of a poor contact caused by failure of sufficiently forming the conductive film at the upper side within the contact hole due to a large aspect of the contact hole.

Furthermore, by providing the etching resist film in the insulating film positioned just under the contact hole, it is possible to prevent the through hole from extending up to an undesired portion such as a semiconductor substrate and other wiring patterns when the through hole is formed in the conductive film at the lower side by the etching process.

DESCRIPTION OF THE PREFERRED EMBODIMENTS

Figure 1A:
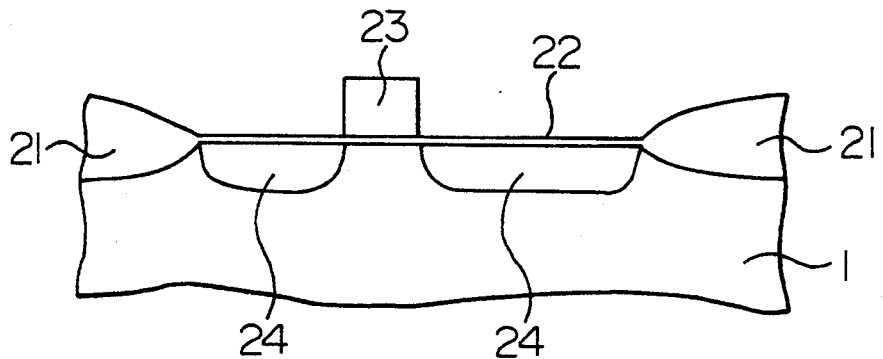
FIGS. 1A–1E show enlarged cross-sectional views of a contact structure of a semiconductor device according to a preferred embodiment of the present invention, in the respective steps, in that order, when manufacturing the semiconductor device.

Referring now to the drawings, a semiconductor device using a contact structure according to a preferred embodiment of the present invention will be described.

As shown in FIG. 1A, in accordance with this preferred embodiment, a field oxide film 21 having a thickness in an order of 400 to 1000 nm is first formed, as an element isolating region, on a P-type silicon substrate 1 with a resistivity of, for instance, 3 to 12 $\Omega$.cm, by utilizing the manufacturing method known in the art. Then, a gate oxide film 22 having a thickness in an order of 10 to 100 nm is formed in an active region by the known thermal oxidation method.

Thereafter, a thin polysilicon film having a thickness in an order of 100 to 500 nm is formed by utilizing the known CVD (chemical vapor deposition) method. Subsequently, P+ (phosphor ion) and the like are thermal diffused in this polysilicon thin film at a density in an order of $4 \times 10^{20}$ to $6 \times 10^{20}$ atoms/cm$^3$ and then this thin film is subjected to fine-processing into a desired pattern for a gate electrode 23.

Next, impurities of As+ (arsenic ion) or P+ (phosphor ion) are introduced into the substrate at an energy level 30 to 90 KeV with a dose of $1 \times 10^{15}$ to $1 \times 10^{16}$ atoms/cm$^2$ by employing the known ion injection method, thereby forming source and drain diffusion layers 24.

Figure 1B:
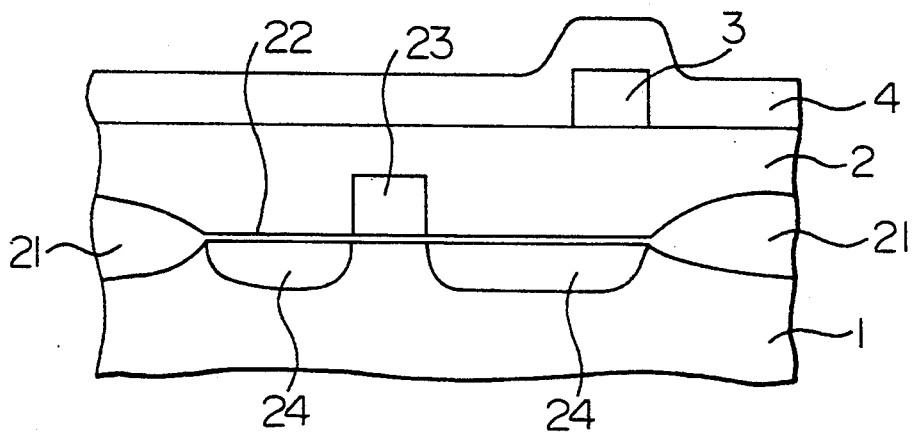

As shown in FIG. 1B, subsequently, on a field oxide film 21, a gate oxide film 22 and a gate electrode 23 which have been formed on the silicon substrate 1, a first insulating film 2 is formed. A thickness of the first insulating film 2 is in an order of 200 to 800 nm, and made of, for instance, a silicon dioxide (SiO$_2$) film.

Then, an etching resist film 3 functioning as an etching stopper is formed on the first insulating film 2. When a polysilicon film is employed for the etching resist film 3, a thickness is in an order of 100 to 200 nm. When a metal film is employed for the etching resist film, a thickness thereof is in an order of 100 to 500 nm. When a silicide film is used for the etching resist film, a thickness thereof is in an order of 100 to 200 nm. For this etching resist film 3, any material such as a material for the gate electrode or the wiring pattern may be employed. Also, this etching resist film 3 may be formed by an insulating film such as a silicon nitride film.

Thereafter, a second insulating film 4 made of, for example, a silicon dioxide film and having a thickness in an order of 200 to 800 nm is formed. Furthermore, as illustrated in FIG. 1C, a contact hole 25 is formed in the resultant semiconductor device by a known fine processing technique.

Figure 1C:
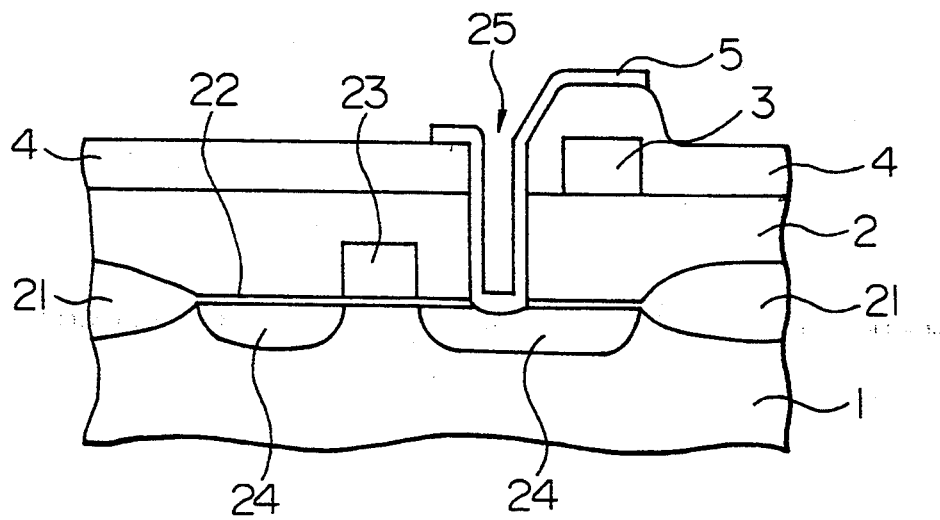

As shown in FIG. 1C, subsequently, a polysilicon thin film 5 used as a high resistance load is formed by employing the CVD method on the inner surface of the contact hole 25 and the second insulating film 4 such that this polysilicon thin film 5 extends over a position just above the etching resist film 3. A thickness of this polysilicon thin film is selected to be in an order of 50 to 200 nm. Next, a third insulating film 6 made of, for instance, a silicon dioxide film is formed with a thickness in an order of 200 to 800 nm.

Figure 1D:
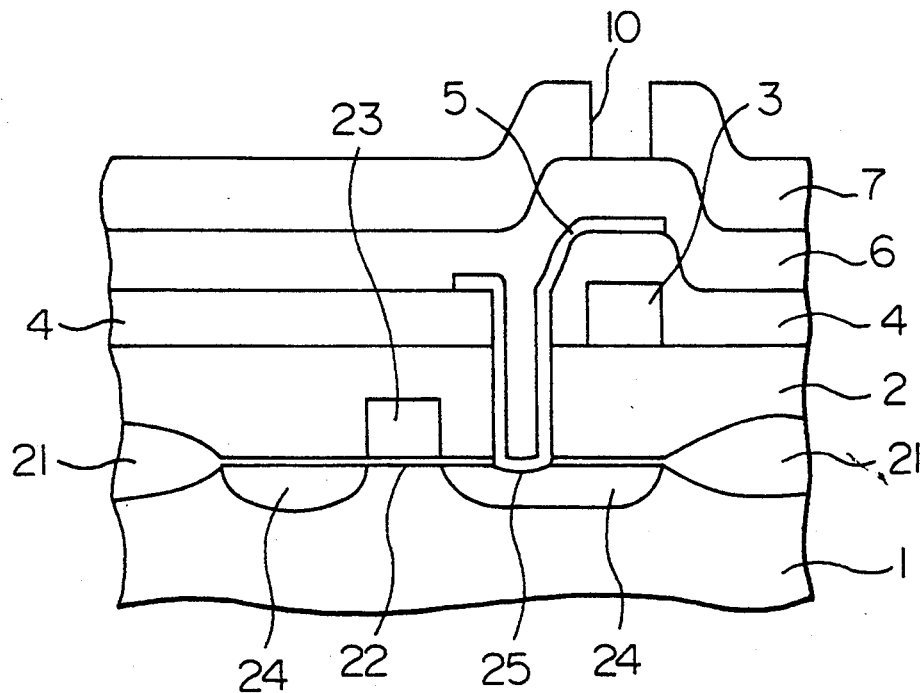

Then, as shown in FIG. 1D, a photoresist mask 7 is formed, and a hole 10 is formed in this photoresist mask 7 at the position just above the etching resist film 3 by fine processing technique.

Figure 1E:
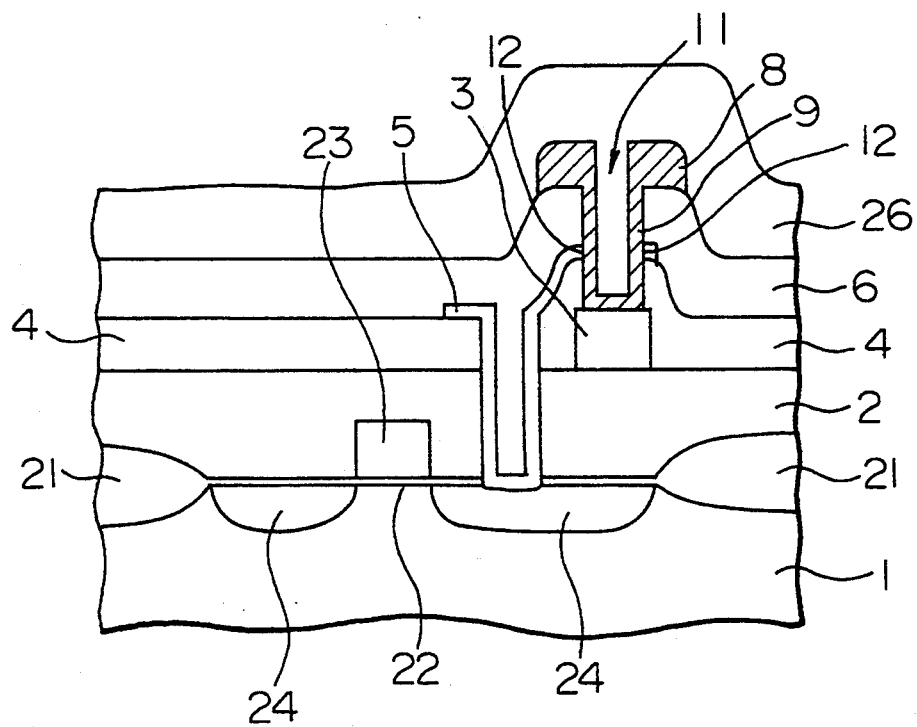

An etching process is thereafter carried out through the hole 10 of this photoresist mask 7 to form a contact hole 11 as shown in FIG. 1E, in the third insulating film 6, and also form a through hole 12 in the polysilicon thin film 5. Furthermore, etching process is applied to the second insulating film 4 to form a continuous hole which reaches the etching resist film 3.

This continuous hole (a series of holes) is required only to penetrate the polysilicon thin film 5, but not required to reach the etching resist film 3. However, it is convenient in control of the etching time to conduct the etching process until the continuous hole reaches the etching resist film 3. In other words, it is very difficult in view of the technical aspect to stop the etching process immediately when the continuous hole has penetrated the thin polysilicon film 5. In order to surely penetrate the thin polysilicon film 5, the insulating film located under the thin polysilicon film 5 must be etched off to some extent. In accordance with the preferred embodiment, the insulating film located under the polysilicon thin film 5 is formed in a two-layer structure of the first insulating film 2 and the second insulating film 4, and the etching resist film 3 is provided between the first insulating film 2 and the second insulating film 4. As a consequence, even when the etching time is set slightly longer to have the continuous hole surely penetrating the polysilicon thin film 5, the etching effect can be always stopped at the etching resist film 3. Therefore, according to this preferred embodiment, it is possible to prevent the continuous hole from completely penetrating all of the insulating films located below the polysilicon thin film 5, and reaching an undesired portion such as the semiconductor substrate 1.

As previously explained, after the contact hole 11 has been formed in the third insulating film 6 and the through hole 12 has been fabricated in the polysilicon thin film 5, a metal wiring film 8 of Al (aluminum) or an Al alloy is with an upper portion 8 formed on the upper surface of the third insulating film 6 and an inner portion 9 formed on both inner surfaces of these holes 11 and 12 by utilizing, for example, the sputtering method and then patterned by way of the fine processing technique. The upper portion 8 of the metal wiring film is formed with a thickness in an order of 500 to 1000 nm and the inner portion 9 of the metal wiring film has a thickness in an order of 50 to 200 nm. The inner portion 9 of the metal wiring film is connected with the polysilicon film 5 at the through hole 12. Then, finally, a passivation film 26 is formed as a protection film by using the known plasma CVD method.

Figure 2:
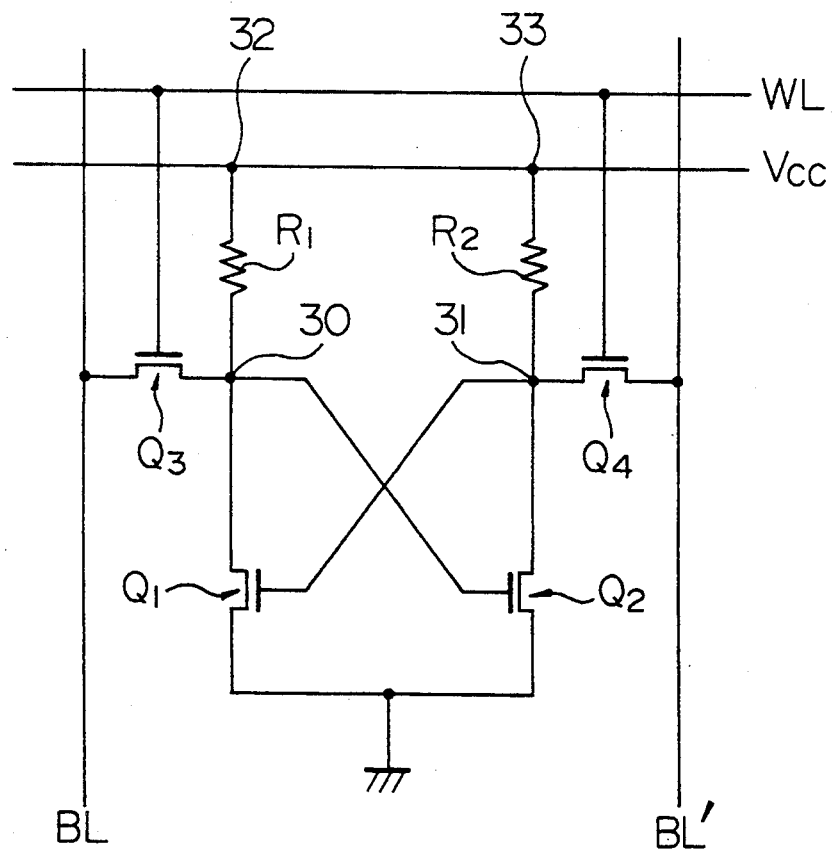
FIG. 2 shows an equivalent circuit of an SRAM having a 4-transistor structure.
Figure 3:
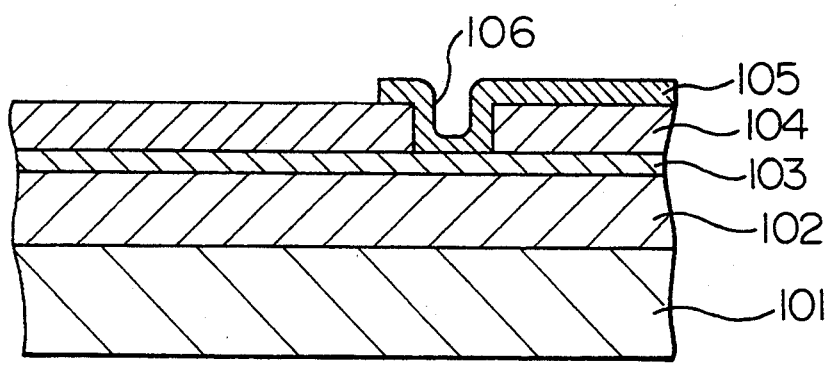
FIG. 3 is an enlarged cross-sectional view of the conventional contact structure between a high load resistance and a semiconductor device.

The relationship between the structure shown in FIG. 1 and an equivalent circuit represented by FIG. 2 is as follows. A Vcc power supply line corresponds to the metal wiring pattern 12; a resistor R1 corresponds to the polysilicon thin film wiring pattern 5; a node 30 corresponds to the contact hole 25; a transistor Q corresponds to a MOS field effect type transistor having the gate electrode 23, the source and drain diffusion layers 24 and the gate oxide film 22; a word line WL corresponds to a gate electrode 23; and also a node 32 corresponds to the contact hole 11 and the through hole 12.

As shown in FIG. 1E, according to the contact structure of this preferred embodiment of the present invention which has been manufactured in the above-described manufacture method, both of the polysilicon thin film 5 positioned below the third insulating film 6 functioning as the inter-layer insulating film and the metal wiring pattern 8 positioned above the polysilicon thin film 5 are mutually connected with each other only at the inner surface of the through hole 12 fabricated in the polysilicon thin film 5. As a result, the load having a higher resistance than that of the conventional semiconductor device can be obtained without making, for instance, the thickness of the polysilicon thin film 5 extremely thin, or specifically designing the size and shape of this polysilicon thin film 5. As a consequence, such a semiconductor device requiring a high resistance load such as an SRAM including the above-described 4-transistor cell having the high load resistance can be realized with high integration, low power consumption and stable characteristics.

It should be noted that although the etching resist film 3 functioning as the etching stopper is employed in the above-described preferred embodiment, this etching resist film 3 may be omitted, if the etching process can be stopped before reaching the semiconductor substrate 1.

What is claimed is:

1. A contact structure of a semiconductor device comprising:
    a semiconductor substrate;
    a lamination of at least first insulating film, first conductive film and second insulating film formed in that order on said semiconductor substrate;
    a through-hole formed to penetrate through at least said second insulating film; said first conductive film and a part of said first insulating film but not to entirely penetrate through said first insulating film so that a cross-section of said first conductive film is exposed to said through-hole at a portion of said through-hole which is distant from a bottom of said through-hole; and
    a second conductive film formed on an inner surface of said through-hole so that said second conductive film is insulated from said semiconductor substrate and electrically contacts with the cross-section of said first conductive film.

2. A contact structure according to claim 1, wherein each of said first and second insulating films contains silicon dioxide.

3. A contact structure according to claim 1, further comprising an etching stopping means formed in said lamination at a preselected position for preventing said through-hole, when said through-hole is formed by etching said lamination, from exceeding said preselected position.

4. A contact structure according to claim 3, wherein said etching stopping means is made of a material selected from polysilicon, metal silicon nitride and silicide.

5. A contact structure according to claim 1, wherein said first conductive film is made of a polysilicon.

6. A contact structure according to claim 5, wherein said first conductive film has a controlled film thickness.

7. A contact structure according to claim 1, wherein said second conductive film is made of a metallic material.

8. A contact structure of a semiconductor device comprising:
    a semiconductor substrate;
    a first insulating film formed on a surface of said semiconductor substrate;
    a lamination of at least a first conductive film formed on said first insulating film and a second insulating film formed on said first conductive film;
    a through-hole formed to penetrate through said lamination and a part of said first insulating film but not to penetrate through said first insulating film so that a cross-section of said first conductive film is exposed to said through-hole at a portion distant from a bottom of said through-hole; and
    a second conductive film formed on said lamination and having an extended portion extending into said through-hole so that said extended portion is insulated from said semiconductor substrate and electrically contact with the cross-section of the first conductive film thereby providing an electrical contact between said first conductive film and said second conductive film.

9. A contact structure according to claim 8, wherein said lamination further includes a third insulating film formed such that said second conductive film is disposed between said first insulating film and said third insulating film and an etching resist film formed in said lamination at a selected position and acting as an etching stopper for preventing said through-hole when said through-hole is formed by etching said lamination, from exceeding said selected position.

10. A contact structure according to claim 9, wherein said etching resist film is made of a material selected from polysilicon, metal, silicon nitride and silicide.

11. A contact structure according to claim 8, wherein said first conductive film is made of a polysilicon.

12. A contact structure according to claim 8, wherein said first conductive film has a controlled film thickness.

* * * * *